(12) United States Patent
Wu

(10) Patent No.: US 10,342,147 B2
(45) Date of Patent: *Jul. 2, 2019

(54) HOUSING DEVICE HAVING PRESS-TYPE LOCKING AND RELEASE STRUCTURE

(71) Applicants: DINKLE ENTERPRISE CO., LTD., New Taipei (TW); DINKLE ELECTRIC MACHINERY (CHINA) CO., LTD., Kunshan, Jiangsu (CN)

(72) Inventor: Shang-Tsai Wu, New Taipei (TW)

(73) Assignees: DINKLE ENTERPRISE CO., LTD., New Taipei (TW); DINKLE ELECTRIC MACHINERY (CHINA) CO., LTD., Kunshan, Jiangsu (CN)

( * ) Notice: Subject to any disclaimer, the term of this patent is extended or adjusted under 35 U.S.C. 154(b) by 424 days.

This patent is subject to a terminal disclaimer.

(21) Appl. No.: 15/406,960

(22) Filed: Jan. 16, 2017

(65) Prior Publication Data
US 2018/0206351 A1    Jul. 19, 2018

(51) Int. Cl.
*H05K 5/02* (2006.01)
*H05K 5/00* (2006.01)
(Continued)

(52) U.S. Cl.
CPC ........... *H05K 5/0221* (2013.01); *E05B 65/52* (2013.01); *E05C 19/06* (2013.01); *H05K 5/0013* (2013.01);
(Continued)

(58) Field of Classification Search
CPC .... H05K 5/0221; H05K 5/023; H05K 5/0013; H05K 7/1427; E05C 3/16
(Continued)

(56) References Cited

U.S. PATENT DOCUMENTS 4,829,595 A * 5/1989 Kobayashi .......... B60R 11/0205
312/7.1
5,020,151 A * 5/1991 Sampei ............... B60R 11/0205
312/7.1
(Continued)

FOREIGN PATENT DOCUMENTS

GB         2211241 A      6/1989

OTHER PUBLICATIONS

Search Report dated Jul. 4, 2017 of the corresponding European patent application.

*Primary Examiner* — Sherman Ng
(74) *Attorney, Agent, or Firm* — Chun-Ming Shih; HDLS IPR SERVICES

(57) ABSTRACT

A housing device having a press-type locking and release structure includes a housing (110), a locking and release member (140), and a control element (150). The housing (110) includes two lateral walls (130), a breach (132) formed at each lateral wall (130), an elongated groove (134) formed along each lateral wall (130), and a pivot hole (136) formed at each lateral wall (130). The locking and release member (140) includes two arms (142) disposed in the two elongated grooves (134), a resilient element (160) disposed at one end of each arm (142), a connection element (170) connected to each arm (142), a fastening element (180) connected to each connection element (170), and a pivot (182) protruding from each fastening element (180). The pivot (182) is pivotally connected to the pivot hole (136). The control element (150) is connected to the two arms (142).

20 Claims, 19 Drawing Sheets

(51) Int. Cl.
  *H05K 7/14* (2006.01)
  *H05K 5/03* (2006.01)
  *E05B 65/52* (2006.01)
  *E05C 19/06* (2006.01)
  *E05C 3/16* (2006.01)
(52) U.S. Cl.
  CPC ........... H05K 5/0026 (2013.01); H05K 5/023 (2013.01); H05K 5/03 (2013.01); H05K 7/1427 (2013.01); *E05C 3/16* (2013.01)
(58) Field of Classification Search
  USPC .................................. 174/561; 361/726, 801
  See application file for complete search history.

(56) References Cited

U.S. PATENT DOCUMENTS

| | | | |
|---|---|---|---|
| 5,152,496 A | 10/1992 | Kobayashi | |
| 5,169,097 A * | 12/1992 | Yasukawa | B60K 37/04 248/27.1 |
| 5,216,904 A * | 6/1993 | Isaki | B60K 37/04 16/445 |
| 5,740,012 A * | 4/1998 | Choi | G06F 1/1616 361/679.39 |
| 5,889,649 A | 3/1999 | Nabetani et al. | |
| 5,953,302 A * | 9/1999 | Kobayashi | G11B 33/123 361/814 |
| 6,231,144 B1 * | 5/2001 | Chen | H05K 7/1411 312/223.2 |
| 7,072,624 B2 * | 7/2006 | Zheng | H04M 1/0249 361/814 |
| 8,496,210 B2 * | 7/2013 | Chang | H05K 5/023 248/221.11 |
| 8,498,120 B2 * | 7/2013 | Chen | H05K 5/0221 312/223.1 |
| 8,737,077 B2 * | 5/2014 | Zhang | G06F 1/187 248/544 |
| 2008/0158810 A1 * | 7/2008 | Liu | G06F 1/187 361/679.33 |

* cited by examiner

HOUSING DEVICE HAVING PRESS-TYPE LOCKING AND RELEASE STRUCTURE

TECHNICAL FIELD

The present invention relates to a housing device and, in particular, to a housing device having a press-type locking and release structure.

BACKGROUND

Electronic devices, like a router, a set-top box, a wireless module, a control module, and a digital input/output device, have different circuit boards inside their housings according to different needs.

Furthermore, the housings of electronic devices normally have one or multiple connection ports like a network port, a video cable port, an audio cable port, and a power port. These connection ports are provided for insertion of related cables/lines. The housings of the electronic devices typically have a rectangular shape. When there is a need to replace or to repair components inside the electronic devices, a user has to pull up the housing with hands to detach it. This is convenient and time-efficient, but lacks flexibly in operations, and cannot satisfy the operation needs for all products.

Accordingly, the target of the inventor is to solve the above-mentioned problems, on the basis of which the present invention is accomplished.

SUMMARY

It is an object of the present invention to provide a housing device having a press-type locking and release structure, for quickly detached from or installed to a casing.

It is another object of the present invention to provide a housing device having a press-type locking and release structure, which enhances flexibility in operations and satisfies users' needs in operations.

Accordingly, the present invention provides a housing device having a press-type locking and release structure, including a housing, a locking and release member, and at least one control element. The housing includes two lateral walls, a breach formed at each lateral wall, an elongated groove formed along each lateral wall, and a pivot hole at each lateral wall. The locking and release member includes two arms disposed in the two elongated grooves, a resilient element disposed at one end of each arm, a connection element connected to each arm, a fastening element connected to each connection element, and a pivot protruding from one side of each fastening element. The pivot is pivotally connected to the pivot hole. The control element is connected to the two arms. When the control element drives the two arms to move, each arm drives movement of each connection element, thereby pushing and moving one end of each fastening element, and the other end of each fastening element is away from the breach.

The present invention collaborates with a casing having two fastening holes. The two fastening holes are disposed corresponding to the two breaches, respectively. The fastening elements of the locking and release member can be engaged with the fastening holes respectively for assembling the housing device to the casing. By means of the lever principle, the pivots of the two fastening elements are pivotally connected to the pivot holes of the housing. By pressing the at least one control element to depress the two arms, the arm pushes one end of the fastening element, and the other end of the fastening element is away from the breach to be released from the fastening hole of the casing. Therefore, quick detachment or assembly can be achieved, thereby facilitating maintenance, replacement or other operations on electronic components inside.

Furthermore, each control element of the present invention includes a push portion, and each of the arms includes a contact end corresponding to each of the push portions. The push portion rotatably or movably or directly pushes the contact end of the locking and release member to move the arm downward. The arm drives movement of the resilient element, the connection element and the fastening element disposed below the arm, so that the fastening element is rotatable to be released from or engaged with the fastening hole of the casing.

Furthermore, the present invention utilizes the control elements of different structures. By operating a connection bar, operating each handle or pressing each unlock button, each arm can be depressed, thereby enhancing flexibility in operations or satisfying users' needs in operations. Moreover, in some embodiments, the control elements are two handles separately disposed; detachment of the housing device from the casing or engagement of the housing device with the casing has to be operated with both hands. However, in different embodiments, there is a connection bar connected to the two handles to allow the users to operate conveniently at one time.

BRIEF DESCRIPTION OF THE DRAWINGS

The disclosure will become more fully understood from the detailed description, and the drawings given herein below is for illustration only, and thus does not limit the disclosure, wherein.

DETAILED DESCRIPTION

Figure 1:
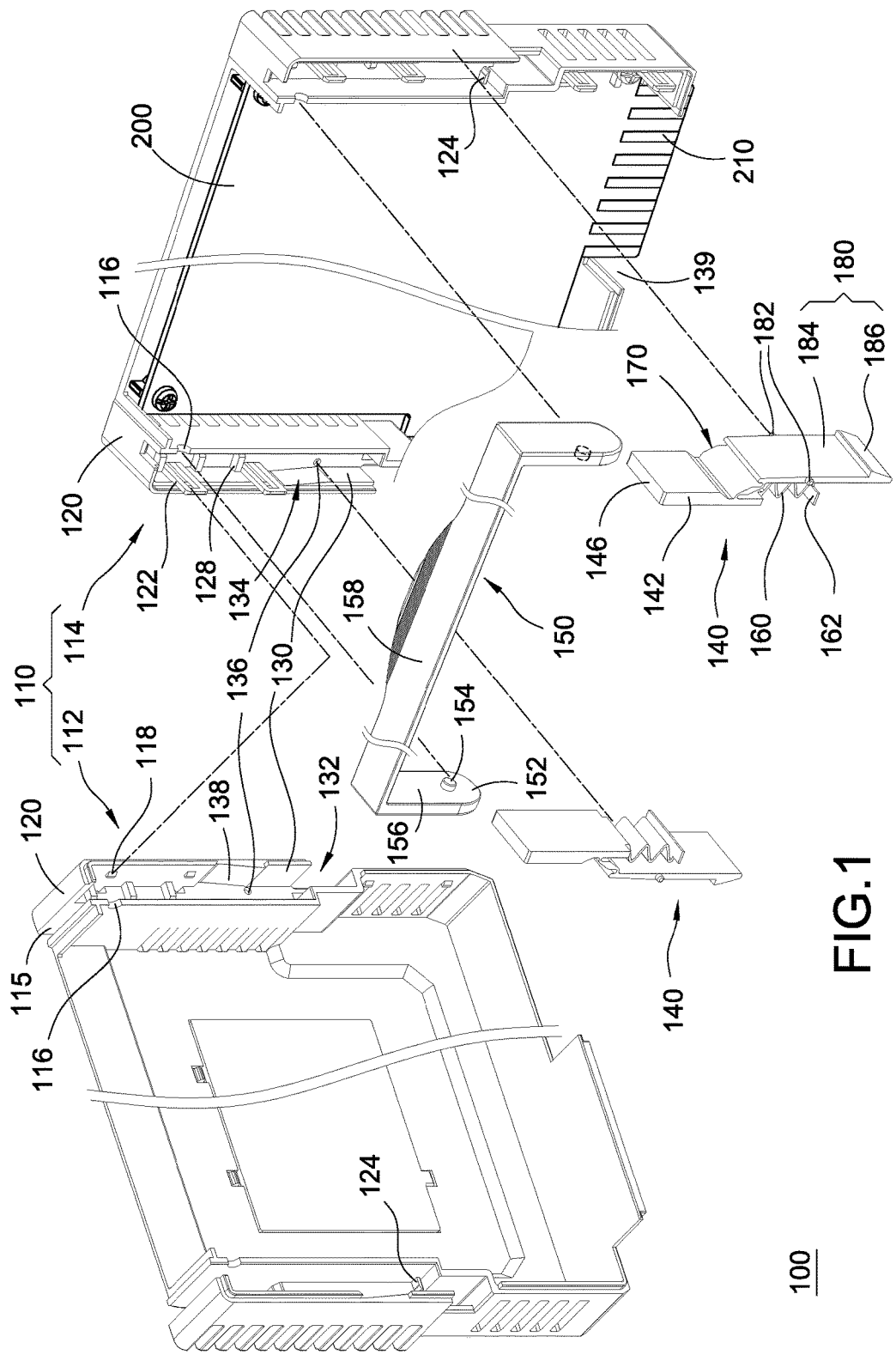
FIG. 1 is a partial exploded view showing a housing device having a press-type locking and release structure according to the first embodiment of the present invention.

Detailed descriptions and technical contents of the present invention are illustrated below in conjunction with the accompany drawings. However, it is to be understood that the descriptions and the accompany drawings disclosed herein are merely illustrative and exemplary and not intended to limit the scope of the present invention.

Referring to FIGS. 1 to 6, the present invention provides a housing device having a press-type locking and release structure, comprising a housing 110, a locking and release member 140, and at least one control element 150. The housing device 100 is preferably used with a casing 10, and they together constitute an electronic device (not labelled). The electronic device includes, but not limited to, a router, a set-top box, a wireless module, a control module, and a digital input/output device, and even includes an industrial personal computer (IPC) or a programmable logic controller (PLC). However, in other embodiments, the housing device 100 is also applied to the housing 110 of a non-electronic device; the present invention is not limited in this regard.

The housing device 100 further includes a circuit board 200 and an electrical insertion end 210 protruding from one end of the circuit board 200. The housing 110 includes an opening 139, and the electrical insertion end 210 protrudes from the opening 139. When the housing device 100 is assembled to the casing 10, the electrical insertion end 210 is correspondingly inserted in an insertion slot 30 of the casing 10 for electrical connection and an assembly purpose.

In the present embodiment, the housing 110 includes two lateral walls 130, a breach 132 formed on each of the lateral walls 130, an elongated groove 134 along each of the lateral walls 130, and a pivot hole 136 formed on each of the lateral walls 130. Each of the pivot holes 136 communicates with a corresponding one of the elongated grooves 134. In the embodiment shown in FIG. 1, the housing 110 is preferably made of plastic and is preferably in a rectangular shape. The housing 110 includes a first housing part 112 and a second housing part 114 coupled to each other.

The first housing part 112 includes a slot 115 communicating with the elongated groove 134 and includes a plurality of fastening points 118 disposed at the lateral wall 130. The second housing part 114 includes a cover plate 120 covering the corresponding elongated groove 134 and includes a plurality of engagement plates 122 disposed corresponding to the fastening points 118. When each engagement plate 122 is engaged with the corresponding fastening point 118, the first housing part 112 is stably secured to the second housing part 114, and the cover plate 120 is disposed corresponding to the slot 115.

The locking and release member 140 is preferably made of plastic and includes two arms 142 disposed in the two elongated grooves 134, a resilient element 160 disposed at one end of each of the arms 142, a connection element 170 connected to each of the arms 142, a fastening element 180 connected to each of the connection elements 170, and a pivot 182 protruding from one side of each of the fastening elements 180. The pivot 182 is pivotally connected to the pivot hole 136, and the fastening element 180 is rotatable about the pivot 182.

Figure 2:
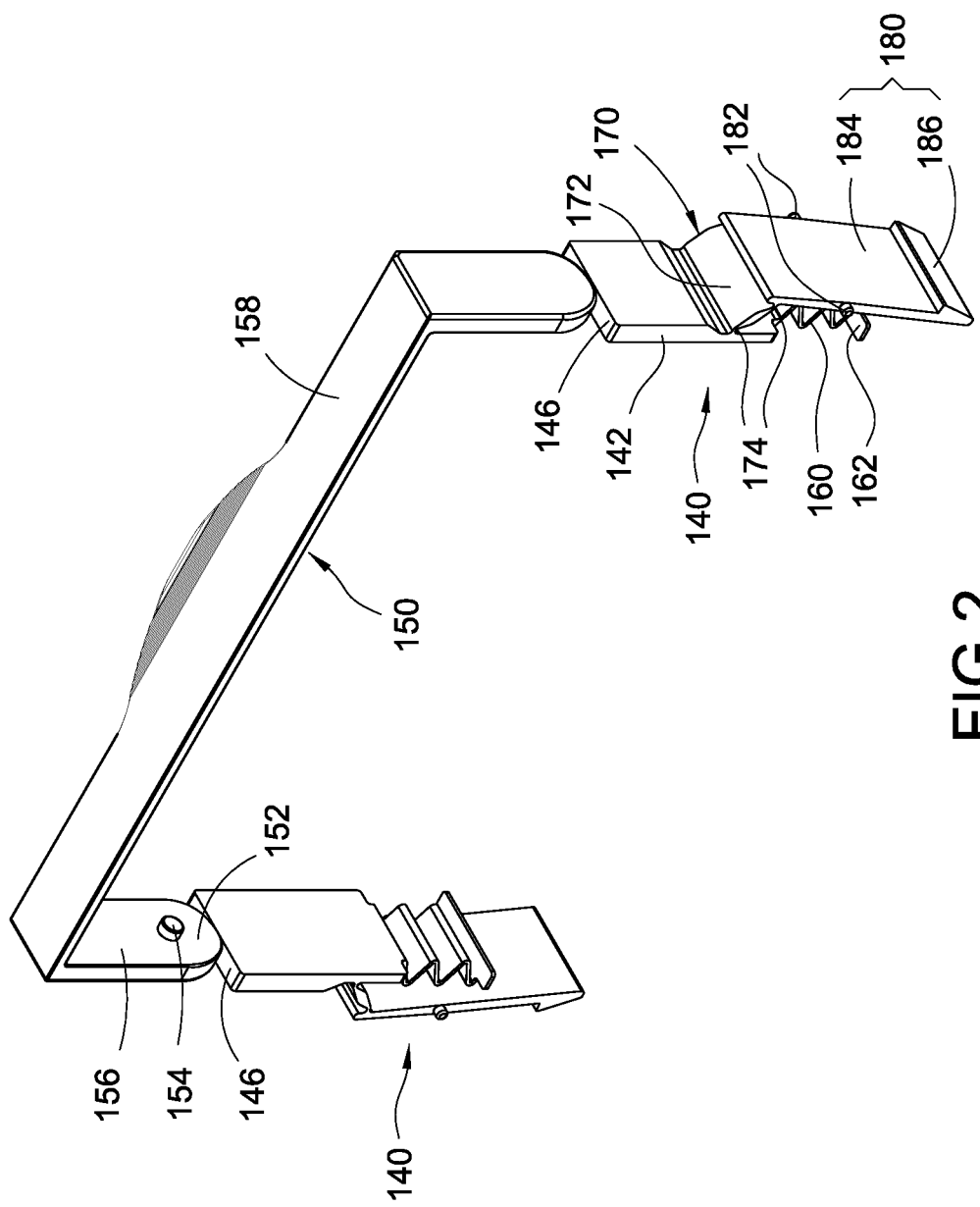
FIG. 2 is a perspective view showing a control element and a locking and release member according to the first embodiment of the present invention.
Figure 3:
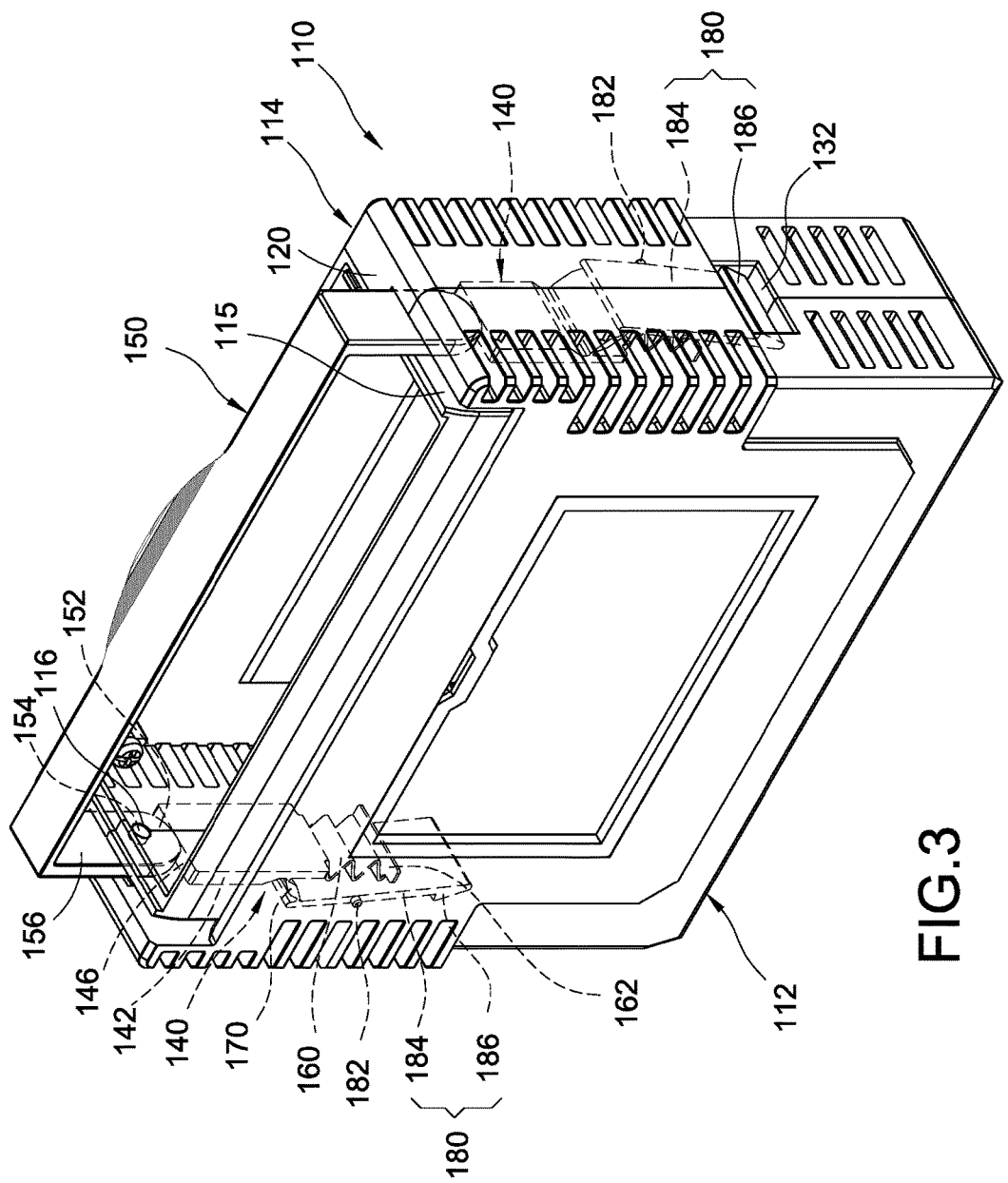
FIG. 3 is a perspective view according to the first embodiment of the present invention.
Figure 4:
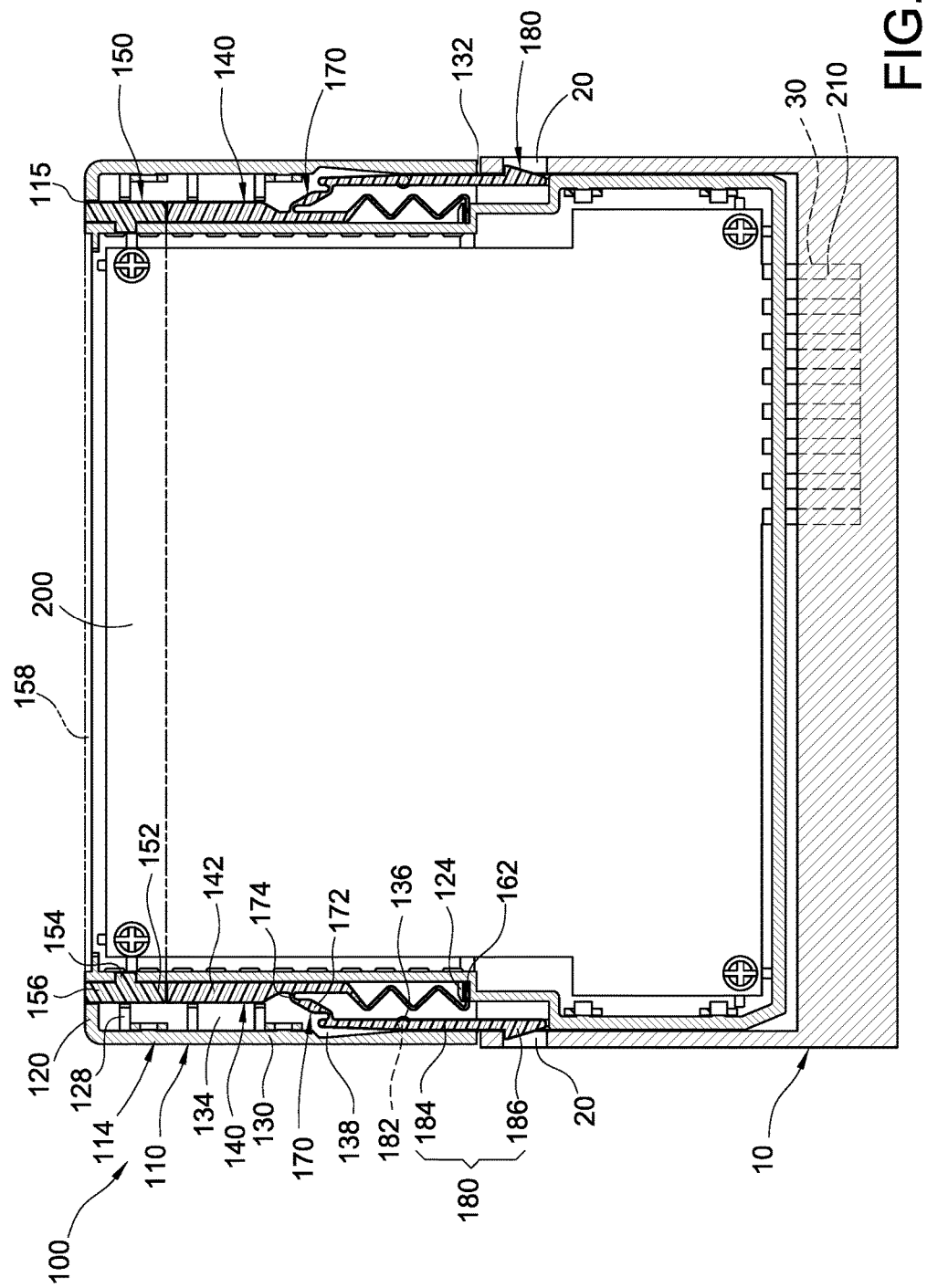
FIG. 4 is a cross-sectional view showing engagement with a casing according to the first embodiment of the present invention.

Referring to FIGS. 2 and 4, each of the arms 142 is preferably disposed parallel to each of the fastening elements 180. The connection element 170 is connected to the arm 142 and the fastening element 180. The connection element 170 is preferably disposed between the arm 142 and the fastening element 180. Each of the connection elements 170 includes a body 172 and includes two connection ends 174 connected to the arm 142 and the fastening element 180 respectively, and a thickness of the connection end 174 is less than a thickness of the body 172.

The connection element 170 made of plastic has a width which preferably corresponds to a width of the arm 142 and a width of the fastening element 180, so the connection element 170 has sufficient strength, and each of the connection ends 174 can be moved easily by movement of the arm 142 or the fastening element 180. Each of the fastening elements 180 includes a fastening plate 184 and a hook 186 at one end of the fastening plate 184, the two pivots 182 protrude from two sides of the fastening plate 184, and each of the hooks 186 is disposed corresponding to each of the breaches 132 for engagement with each of the fastening holes 20.

Each of the lateral walls 130 includes a recess 138 adjacent to the pivot hole 136, and the recess 138 receives one end of the fastening element 180. The pivot 182 preferably protrudes from the middle of the fastening plate 184, and thereby the fastening element 180 can rotate about the pivot 182, the recess 138 receives one end of the fastening plate 184, and as a result, the hook 186 at the other end of the fastening element 180 can be released from the fastening hole 20 (i.e., away from the breach 132).

Each resilient element 160 and the arm 142 are preferably made of plastic or suitable materials. Each resilient element 160 is preferably a flat spring or a plate spring juxtaposed with the corresponding fastening element 180 in the elongated groove 134. In other words, each resilient element 160 is preferably connected to a lower end of each arm 142 in an integral form. However, in different embodiments, each resilient element 160 can be a compression spring or other suitable spring assembled between the arm 142 and the housing 110; the present invention is not limited in this regard.

Moreover, one end of each resilient element 160 includes a positioning end 162, the housing 110 includes a joining member 124 corresponding to the positioning end 162, and the positioning end 162 is engaged with the joining member 124. The resilient elements 160 can elastically restore the two arms 142 to their initial positions. In the first embodiment shown in FIG. 2, the positioning end 124 of the flat spring is preferably an insertion plate, and the joining member 124 of the housing 110 is a positioning block or other suitable part for insertion and fixation of the insertion plate.

The at least one control element 150 is connected to the two arms 142. When the at least one control element 150 drives the two arms 142 to move with respect to the two elongated grooves 134, each of the arms 142 drives each of the connection elements 170 to move one end of each of the fastening elements 180, and the other end of each of the fastening elements 180 is away from the breach 132. In other words, the housing device 100 is disengaged and released from the two fastening holes 20. When a user pulls up, the electrical insertion end 210 of the housing device 100 is removed from the insertion slot 30 of the casing 10.

Each control element 150 includes a push portion 152 for pushing each arm 142, a pivot portion 154 pivotally connected to the housing 110, and a handle 156 connected to the pivot portion 154. Each of the arms 142 of the locking and release member 140 includes a contact end 146 corresponding to each of the push portions 152. The housing 110 has an aperture 116 disposed corresponding to the pivot portion 154, and the handle 156 protrudes out of the housing 110.

Figure 5:
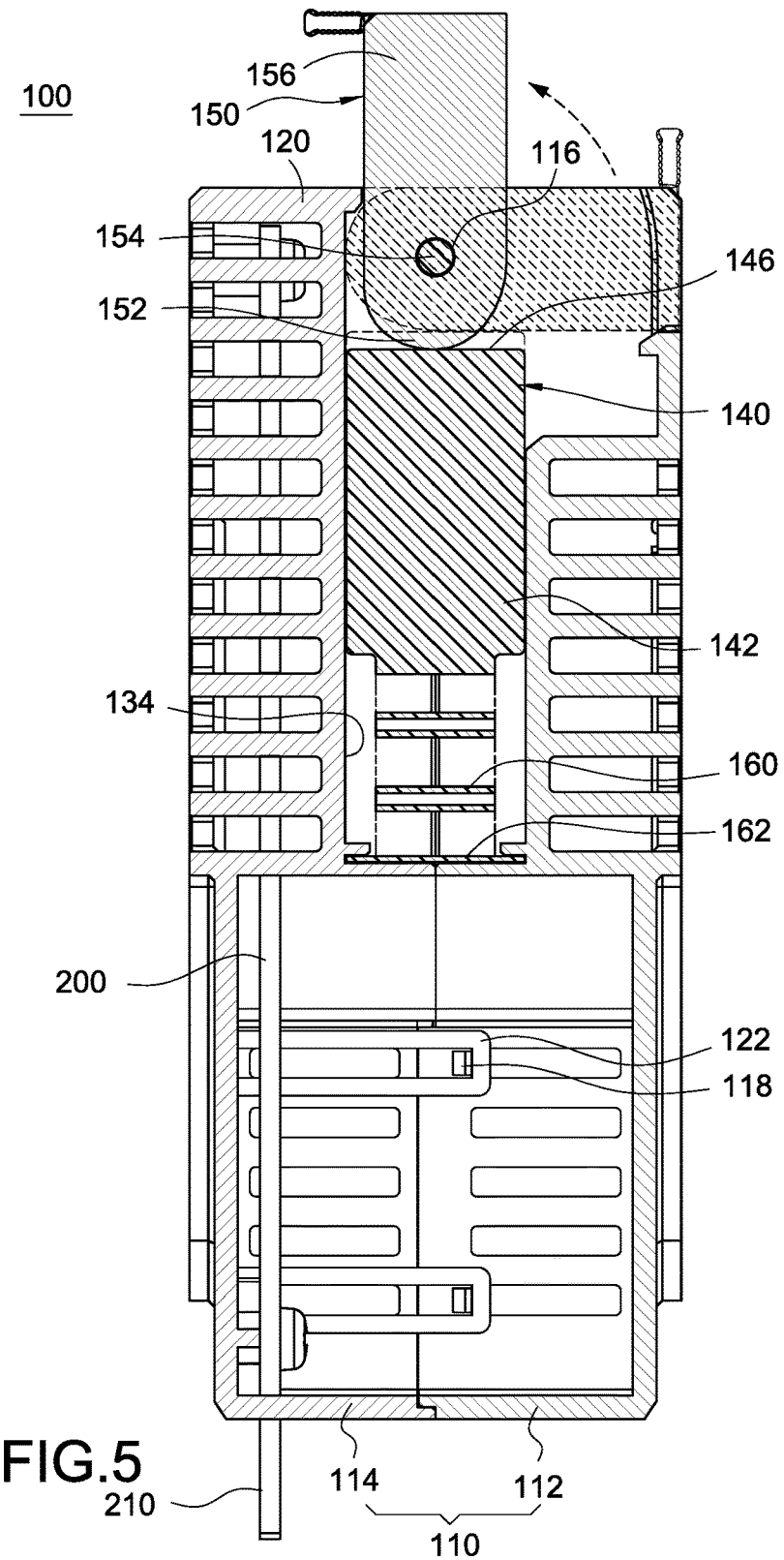
FIG. 5 is a cross-sectional view from another viewing angle according to the first embodiment of the present invention.
Figure 6:
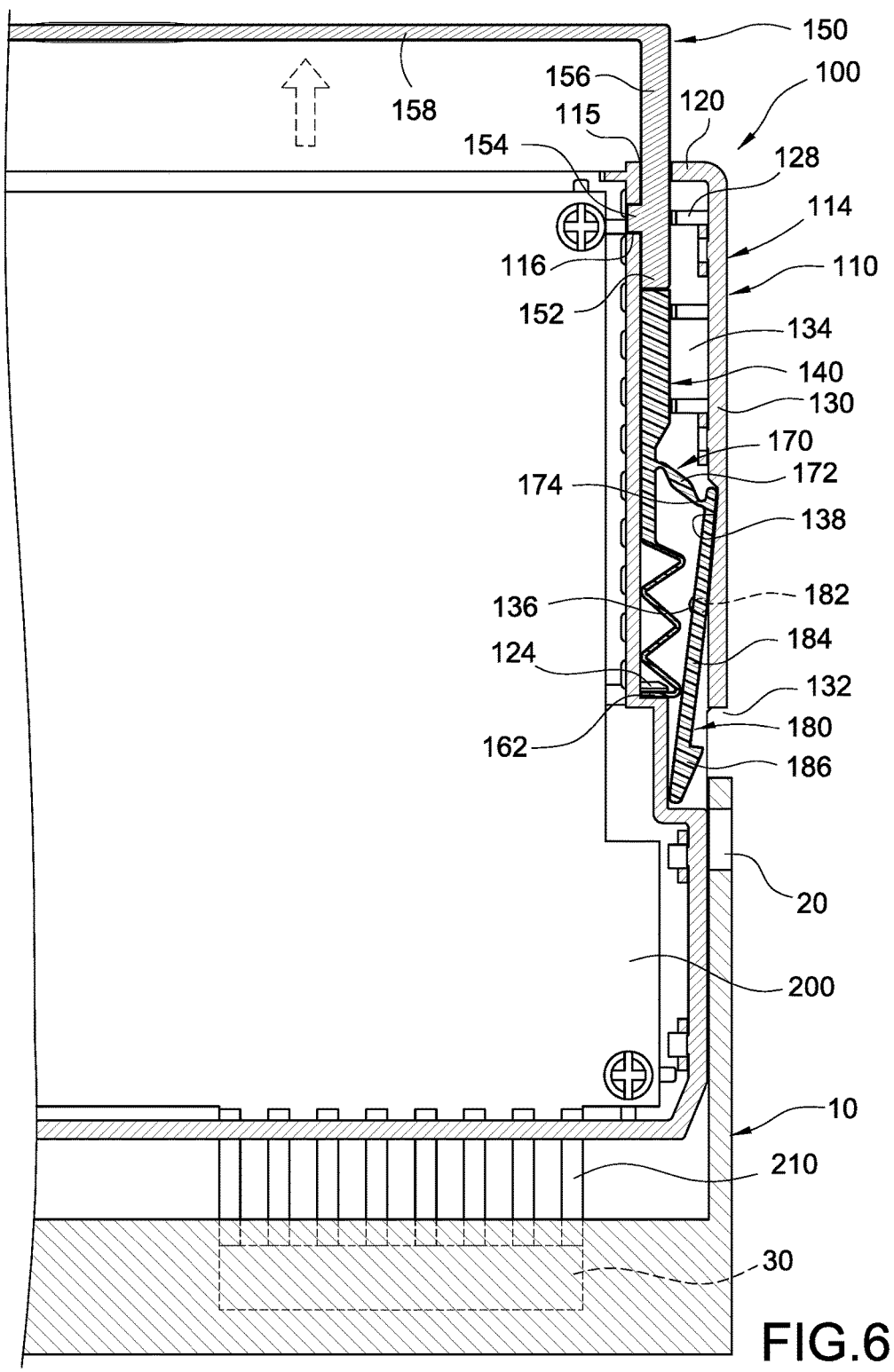
FIG. 6 is a cross-sectional view showing the housing device released from the casing according to the first embodiment of the present invention.

In the first embodiment shown in FIGS. 4 to 6, the control element 150 further includes a connection bar 158 connected to each handle 156. By rotating the connection bar 158, the two handles 156 are rotated to drive the push portions 152 to push each arm 142 downward. In the present embodiment, the push portion 152 is preferably an arc portion, and the contact end 146 is a planar surface. When the push portion 152 of each control element 150 rotatably pushes the contact end 146 of each arm 142, the arm 142 pushes down the connection element 170 to thereby move one end of the fastening element 180. By means of the lever principle, one end of the fastening element 180 moves to the recess 138, and the hook 186 is away from the breach 132, so that the fastening element 180 is disengaged and released from the fastening hole 20. At the same time, the resilient element 160 is compressed to store energy.

That is to say, when the connection bar 158 is rotated from a locking position to a releasing position, the slot 115 of the housing 110 receives the handle 156, and the connection bar 158 is rotated to above the cover plate 120. At this point, the user can rapidly detach the housing device 100 from the casing 10 by pulling up the connection bar 158, in a convenient and time-saving manner.

Furthermore, the pivot portion 154 of each control element 150 is positioned in the aperture 116 of the housing 110, the pivot 182 of the fastening element 180 is pivotally connected to the pivot hole 136, and the positioning end 162 of the resilient element 160 is fastened to the joining member 124. Therefore, by operating the connection bar 158 or each handle 156, the user can easily detach the housing device 100 from the casing 10 or assemble the housing device 100 to the casing 10.

After maintenance or replacement, the housing device 100 can be assembled to casing 10. That is to say, when each control element 150 returns from the releasing position to the locking position, each resilient element 160 releases the stored energy to exert an elastic force to automatically push back each arm 142, and each connection element 170 pulls each fastening element 180. By means of the lever principle, the hook 186 returns to the breach 132 to be engaged with the fastening hole 20 again, so the electrical insertion end 210 of the housing device 100 is again electrically coupled to an insertion slot 30 of the casing 10.

Figure 7:
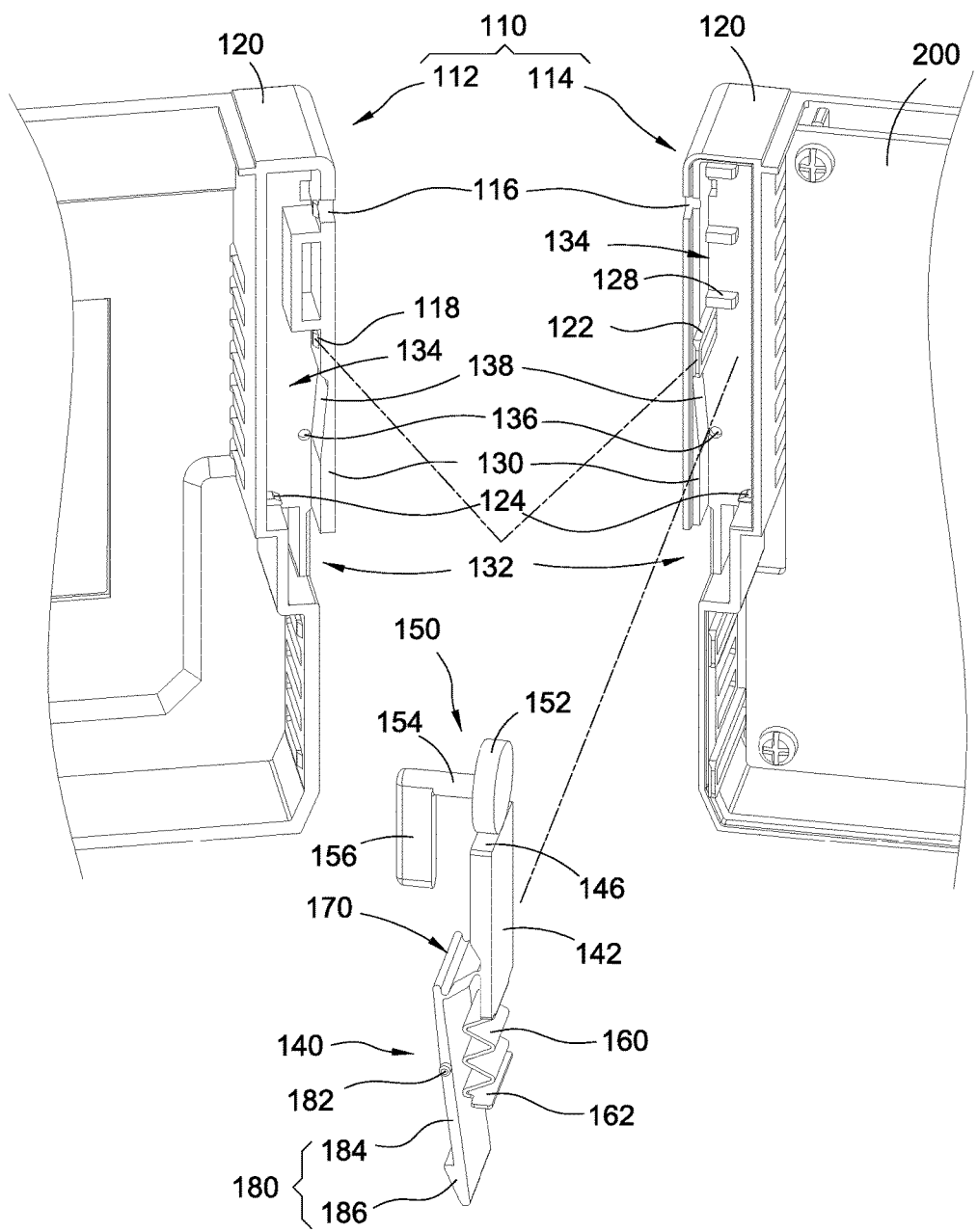
FIG. 7 is a partial exploded view according to the second embodiment of the present invention.
Figure 8:
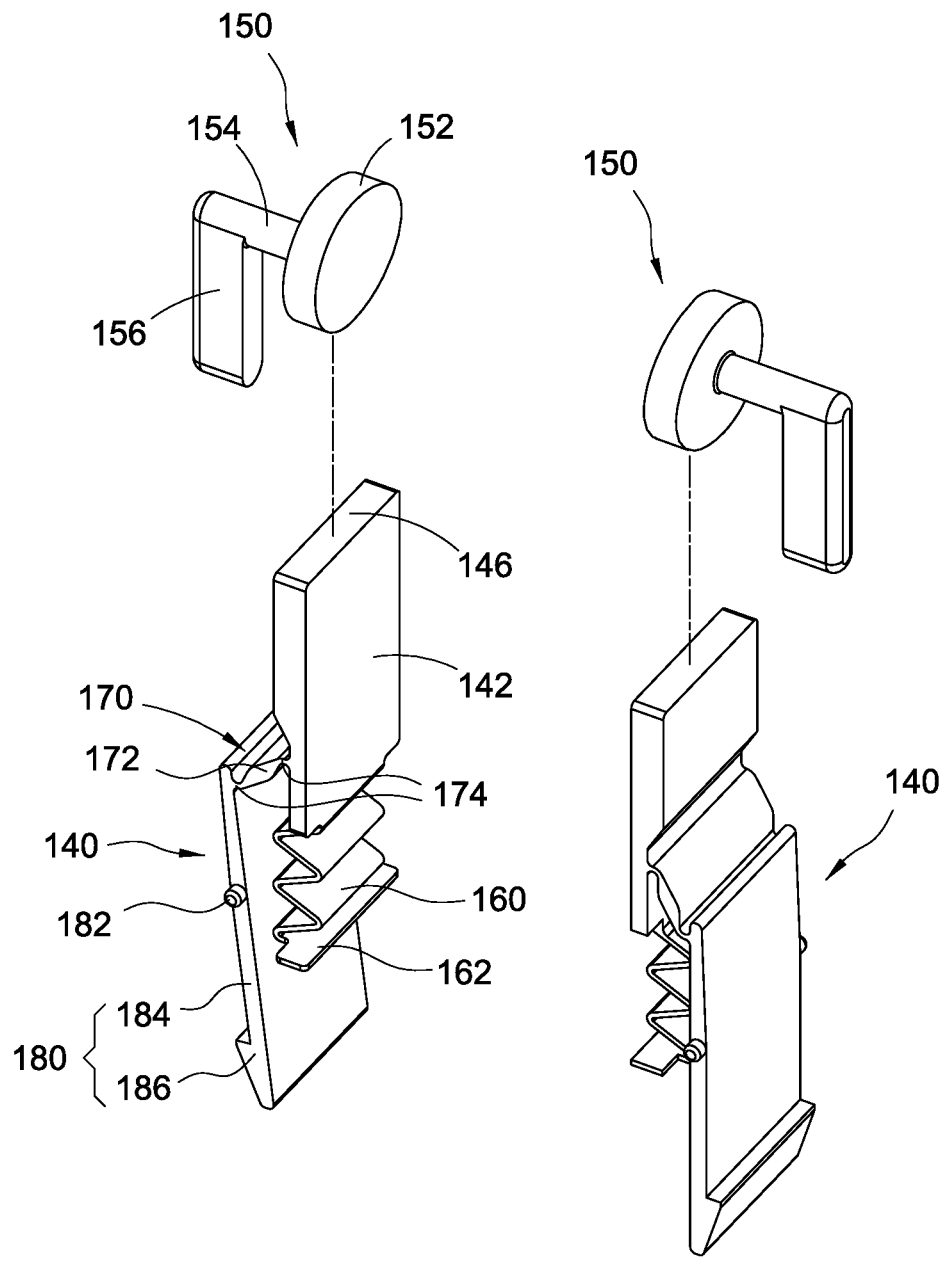
FIG. 8 is a perspective view showing the control element and the locking and release member according to the second embodiment of the present invention.
Figure 9:
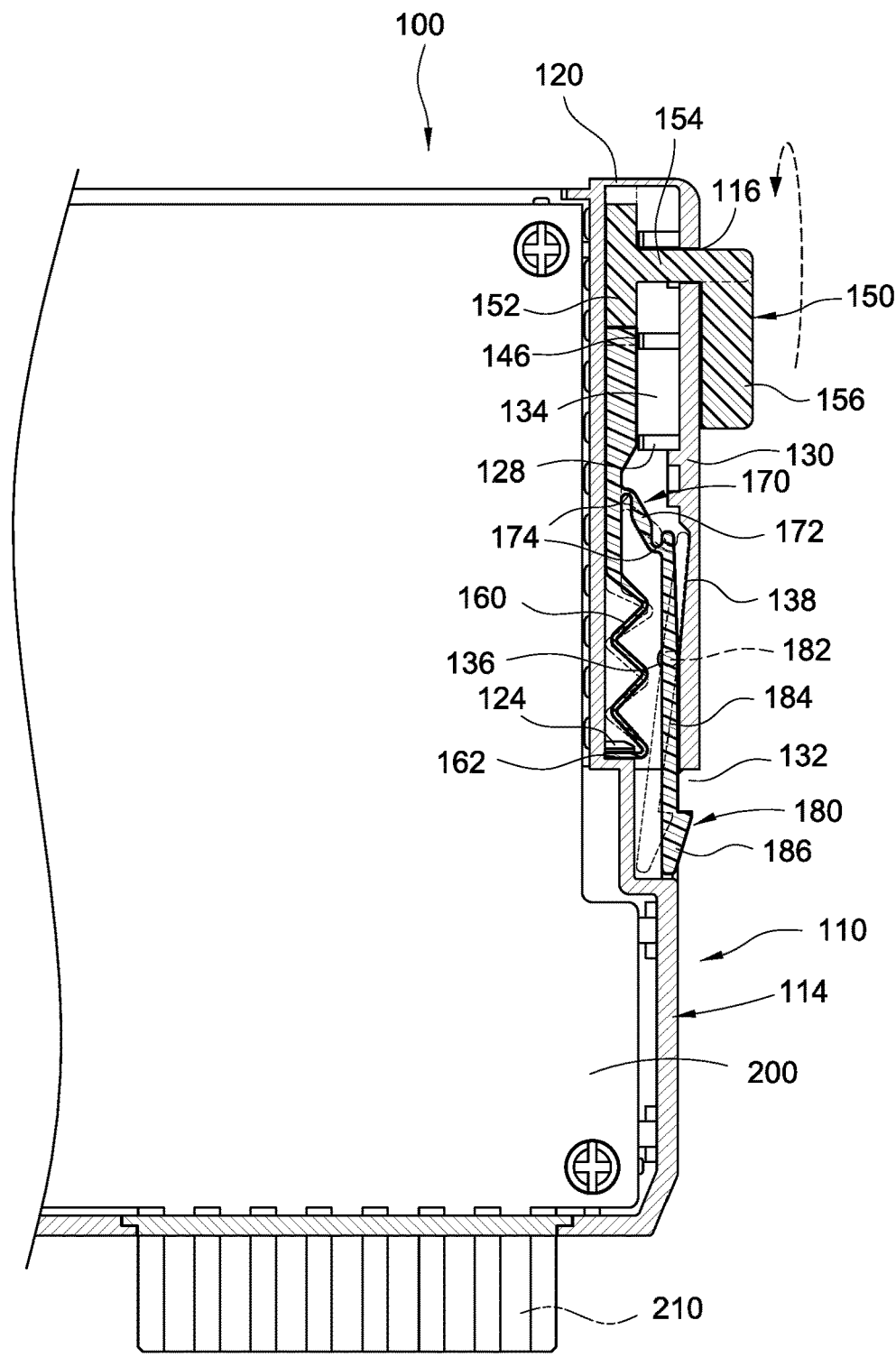
FIG. 9 is a partial cross-sectional view showing the second embodiment of the present invention.

Please refer to FIGS. 7 to 9, showing a partial exploded view of the second embodiment, and a perspective view and a partial cross-sectional view showing the control element and the locking and release member according to the second embodiment. The present embodiment is different from the first embodiment in that, the push portion 152 of each control element 150 is preferably a cam having an arc periphery, and the contact end 146 of each arm 142 is a planar surface. The aperture 116 is formed on the lateral wall 130 for insertion of the pivot portion 154, and the handle 156 perpendicularly connected to the pivot portion 154 protrudes out of the lateral wall 130 for easy operations of users.

When the user rotates the two handles 156 (i.e. rotating them from the locking position to the releasing position), the push portion 152 in the cam form rotatably pushes the arm 142 having a planar surface to move downward. By means of the lever principle, the hook 186 of the fastening element 180 is rotated to be released from the fastening hole 20 of the casing 10, so as to be detached from the casing 10. Details regarding other components and connection relationships of the present embodiment are described above in the first embodiment, so a description thereof is omitted herein for brevity.

Figure 10:
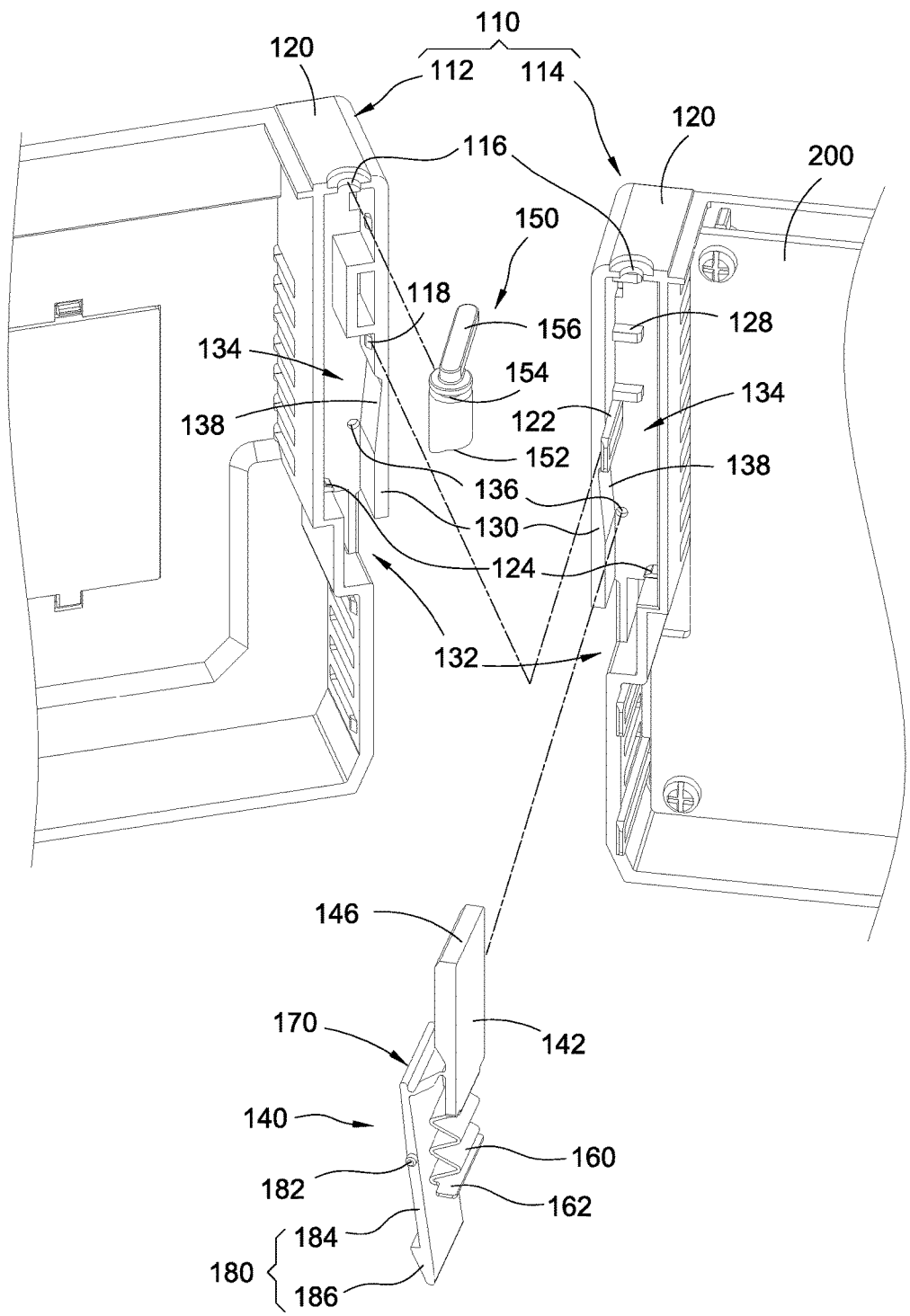
FIG. 10 is a partial exploded view according to the third embodiment of the present invention.
Figure 11:
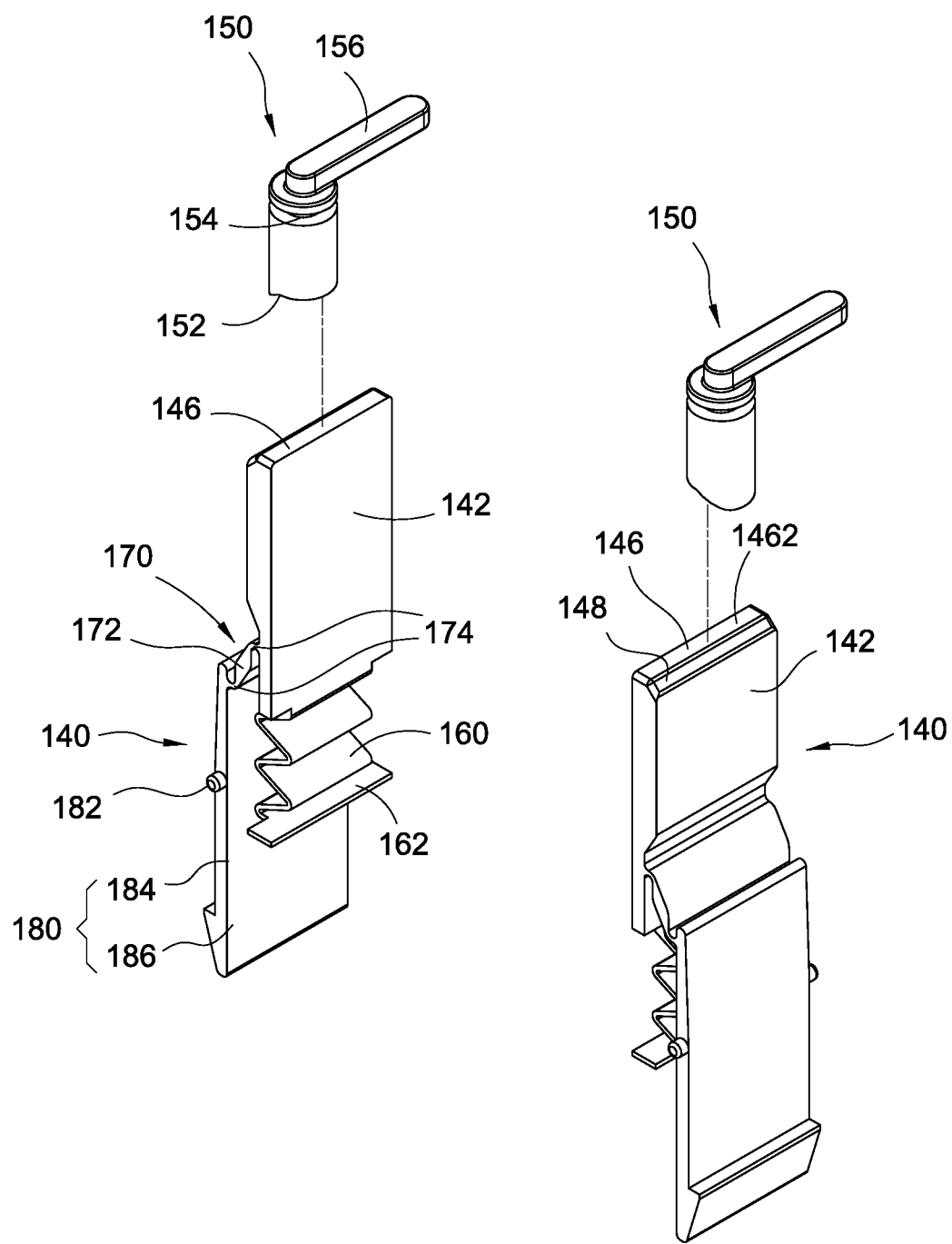
FIG. 11 is a perspective view showing the control element and the locking and release member according to the third embodiment of the present invention.
Figure 12:
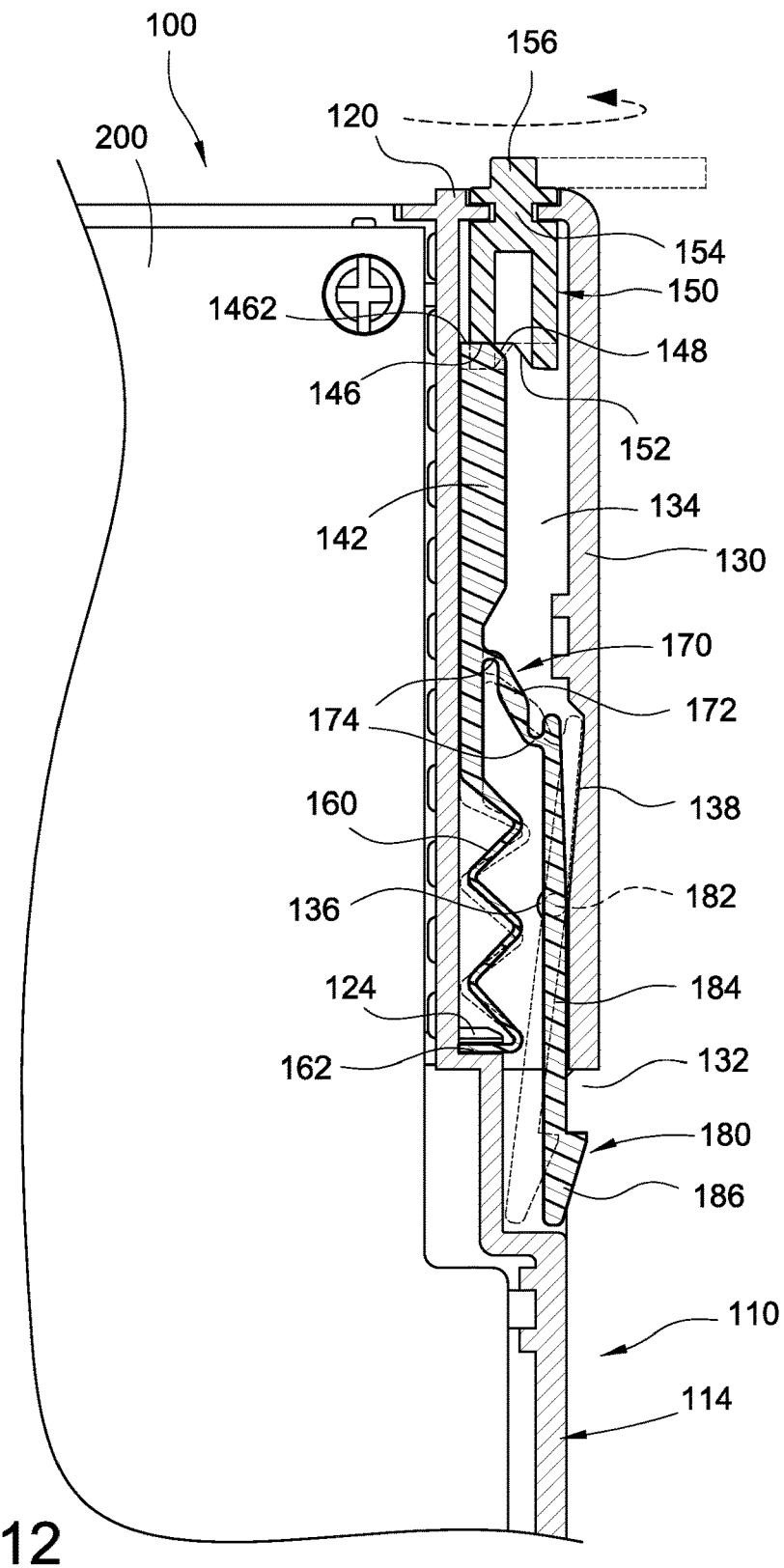
FIG. 12 is a partial cross-sectional view according to the third embodiment of the present invention.

Please refer to FIGS. 10 to 12, showing a partial exploded view, a perspective view showing the control element and the locking and release member, and a partial cross-sectional view, according to the third embodiment of the present invention. The present embodiment is different from the above embodiments in that, the push portion 152 of each control element 150 is preferably a cylindrical cam. The contact end 146 of each arm 142 includes a planar surface 1462 and a chamfer 148 connected to the planar surface 1462. As shown in the drawings, the cylindrical cam is hollow. One end of the cylindrical cam has a curved periphery to successfully cross the chamfer 148 to push the planar surface 1462. The aperture 116 is formed on the cover plate 120 for engagement with the pivot portion 154. Each handle 156 is perpendicularly connected to the pivot portion 154 and protrudes out of the cover plate 120 for easy operations of the users.

When the user rotates each handle 156, the push portion 152 is rotated to cross the chamfer 148 to push the planar surface 1462, so that each arm 142 moves downward with respect to the elongated groove 134. In the present embodiment, when the push portion 152 in the form of the cylindrical cam rotatedly moves from a low position to a high position, one side of the fastening element 180 moves and the fastening element 180 is rotated to be released from the casing 10. When the housing device 100 is assembled to the casing 10, the stored energy of the resilient element 160 is released to exert the elastic force to push each arm 142 back to the initial position. If the elastic force is properly designed, the contact end 146 automatically pushes back the push portion 152 to restore the handle 156 to its original position/a locking state.

Figure 13:
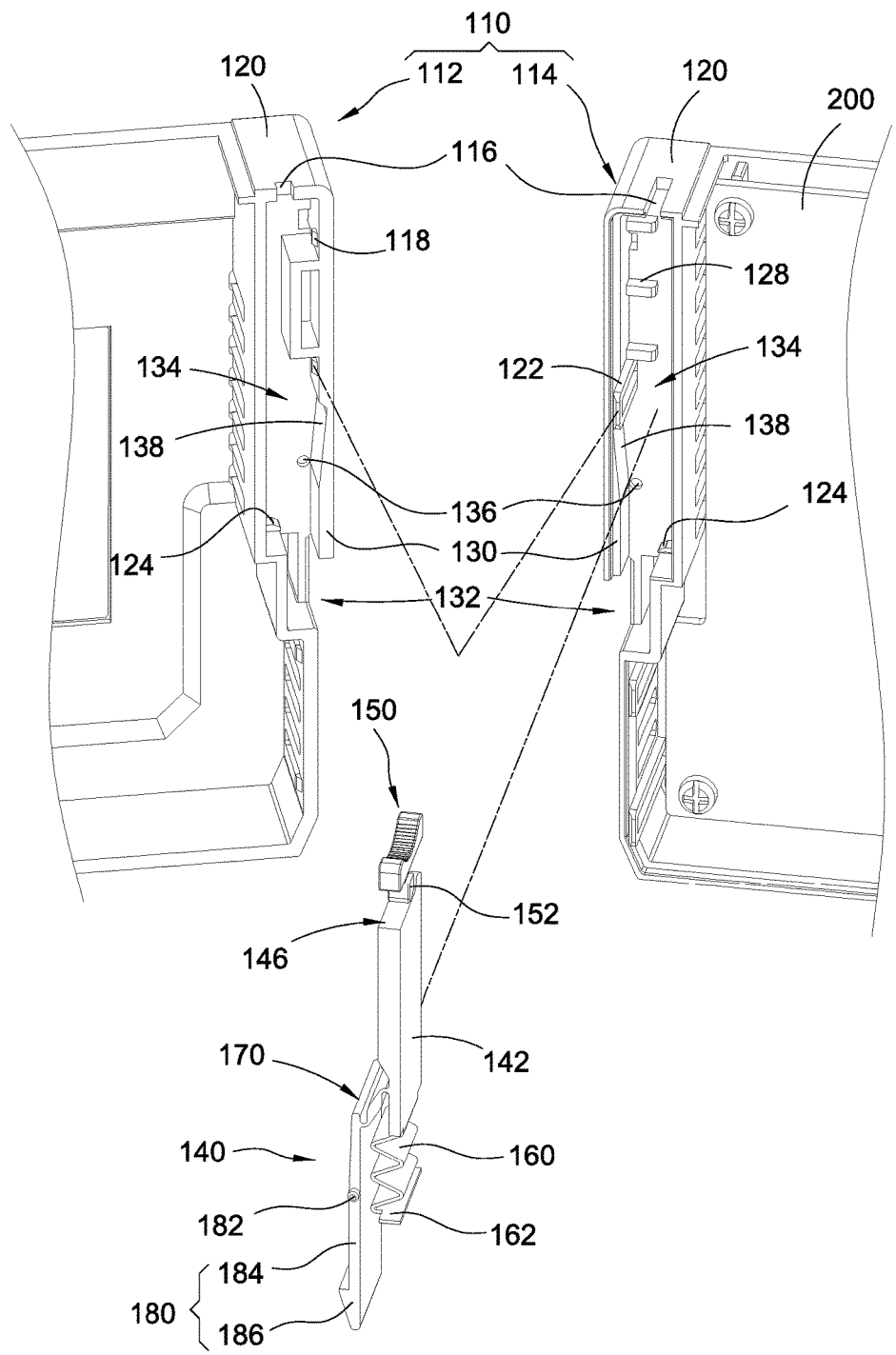
FIG. 13 is a partial exploded view according to the fourth embodiment of the present invention.
Figure 14:
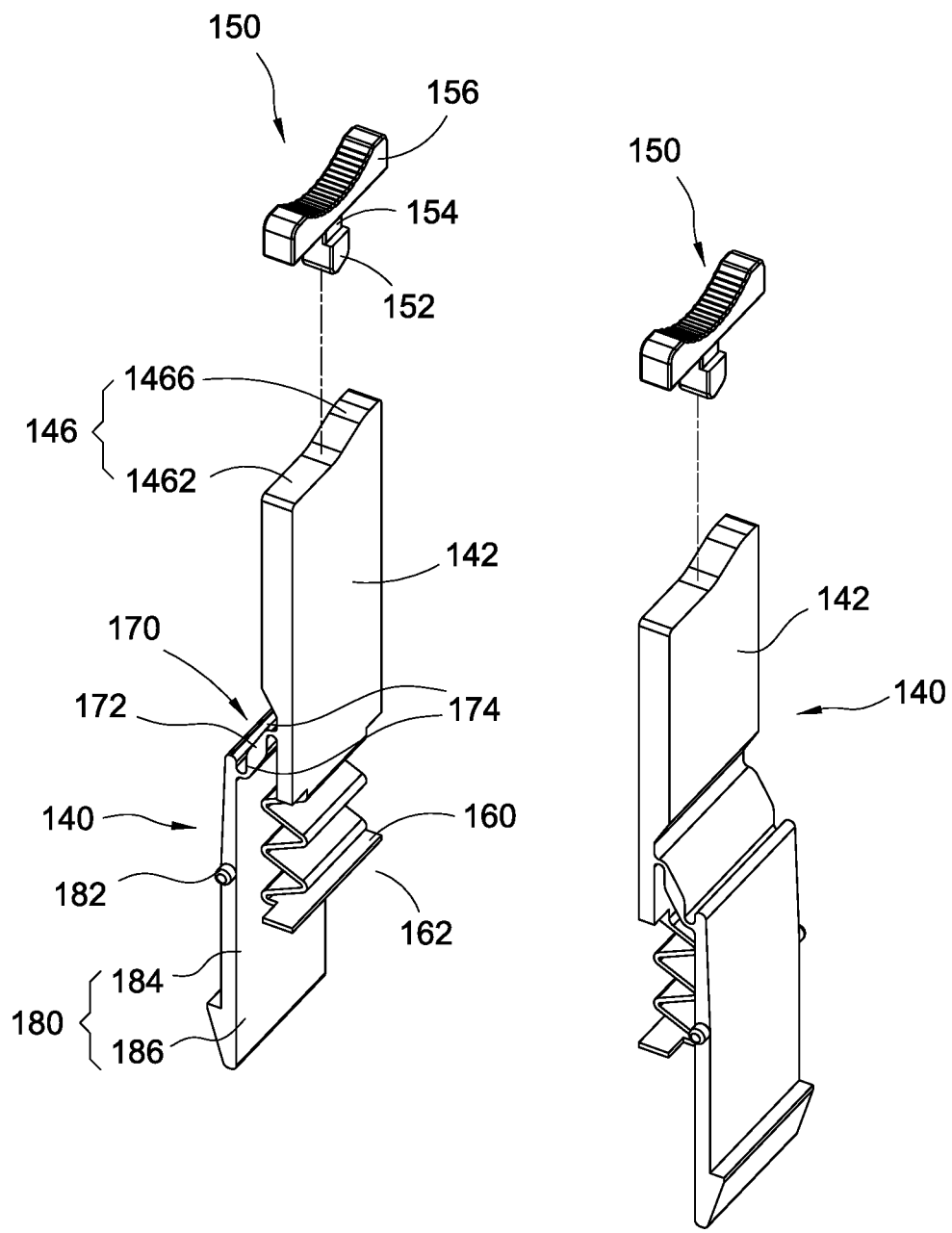
FIG. 14 is a perspective view showing the control element and the locking and release member according to the fourth embodiment of the present invention.
Figure 15:
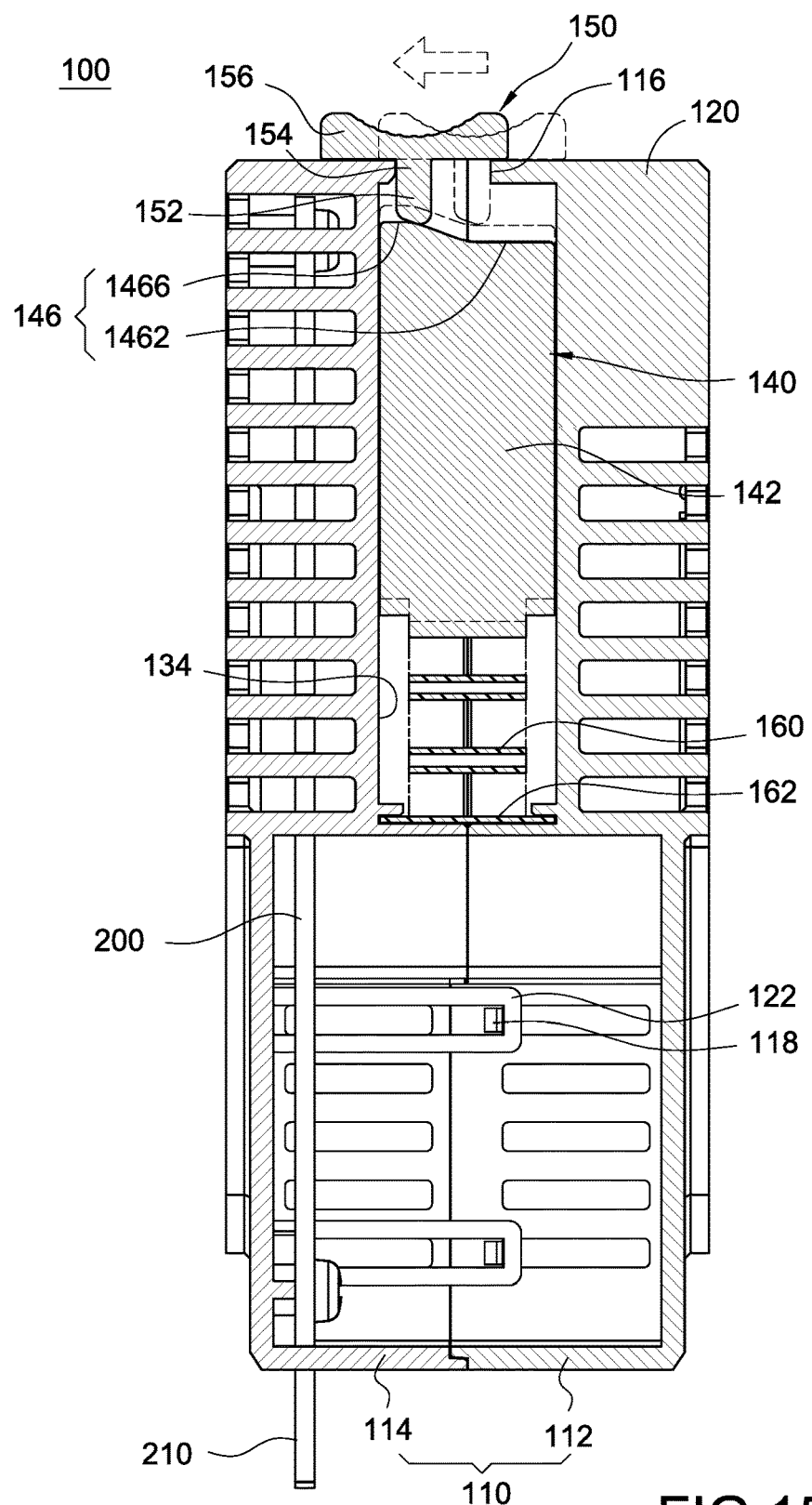
FIG. 15 is a cross-sectional view according to the fourth embodiment of the present invention.
Figure 16:
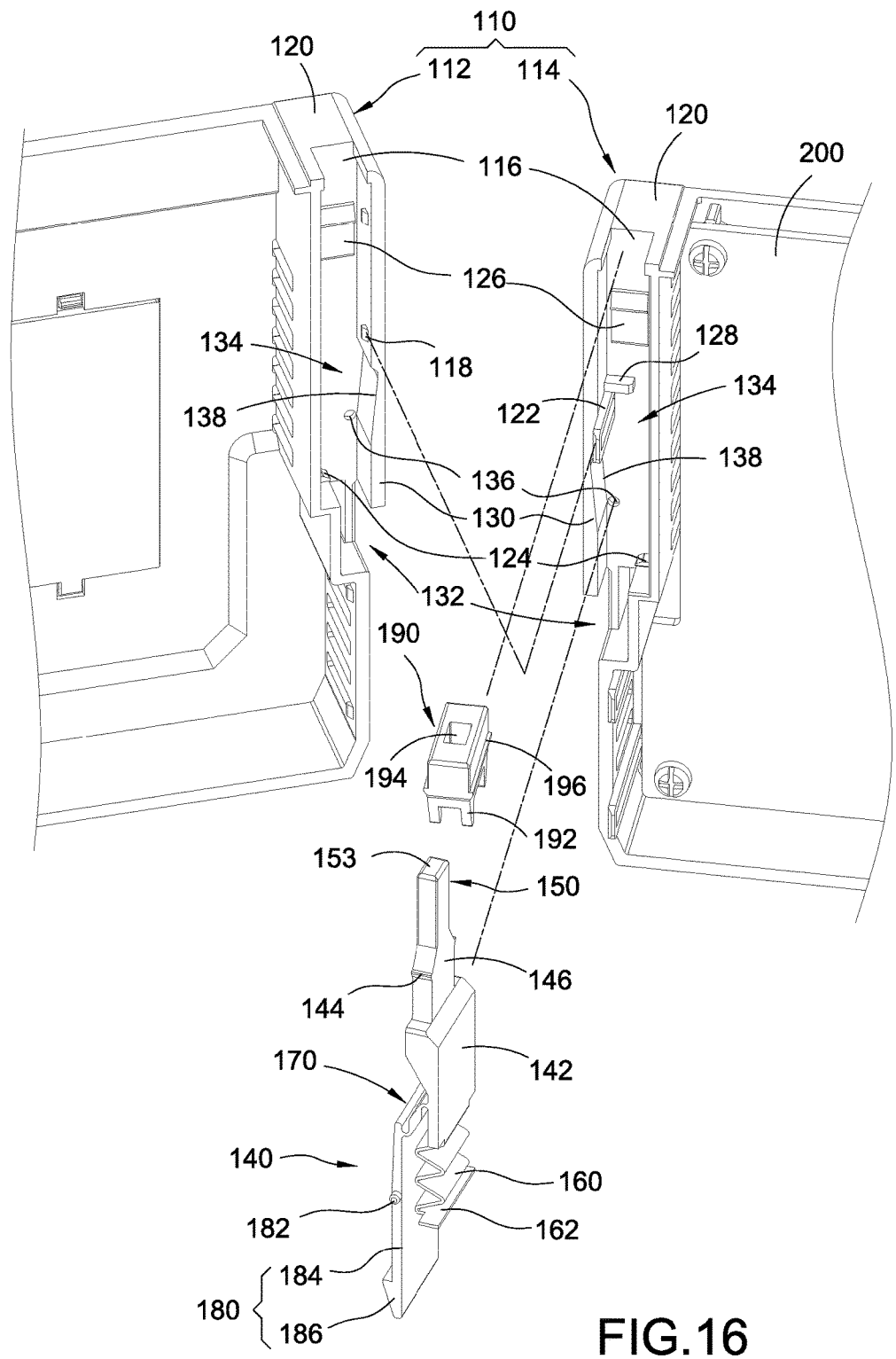
FIG. 16 is an exploded view according to the fifth embodiment of the present invention.

Please refer to FIGS. 13 to 15, showing a partial exploded view, a perspective view of the control element and the locking and release member, a cross-sectional view according to the fourth embodiment of the present invention. The present embodiment is different from the above embodiments in that, the push portion 152 of each control element 150 preferably includes a curved surface or an arc portion, and each of the contact ends 146 includes a planar surface 1462 and a curvy surface 1466 connected to the planar surface 1462. When the push portion 152 having the curved surface or the arc portion moves from the planar surface 1462 to the curvy surface 1466, the arm 142 is pushed to move downward. The aperture 116 is formed on the cover plate 120, and the handle 156 is vertically connected to the push portion 152 and protrudes out of the cover plate 120.

When the pivot portion 154 of each handle 156 moves parallelly along the aperture 116, each push portion 152 moves from the planar surface 1462 to the curvy surface 1466 to push the arm 142 downward, and thereby the housing device 100 is released from the casing 10. When the housing device 100 is assembled to the casing 10, the resilient element 160 recoils and pushes each arm 142 to restore the hook 186 to its original position. At this point, the push portion 152 moves along the contact end 146, from the curvy surface 1466 to the planar surface 1462, so that the handle 156 is restored to its original position/the locking state.

Please refer to FIGS. 16 to 20 showing the fifth embodiment of the present invention. The fifth embodiment is different from the above embodiments in that, the push portion 152 of each control element 150 is a button 153, and each of the contact ends 146 is integrally formed with each of the buttons 153. In other words, each of the control elements 150 is preferably integrally formed with each of the arms 142. As shown in the drawings, the housing 110 further includes two resilient clasps 126 extending from two sides of each elongated groove 134 respectively. Each arm 142 includes two protrusions 144 corresponding to the two resilient clasps 126 for engaging and locking each button 153 in position.

Figure 17:
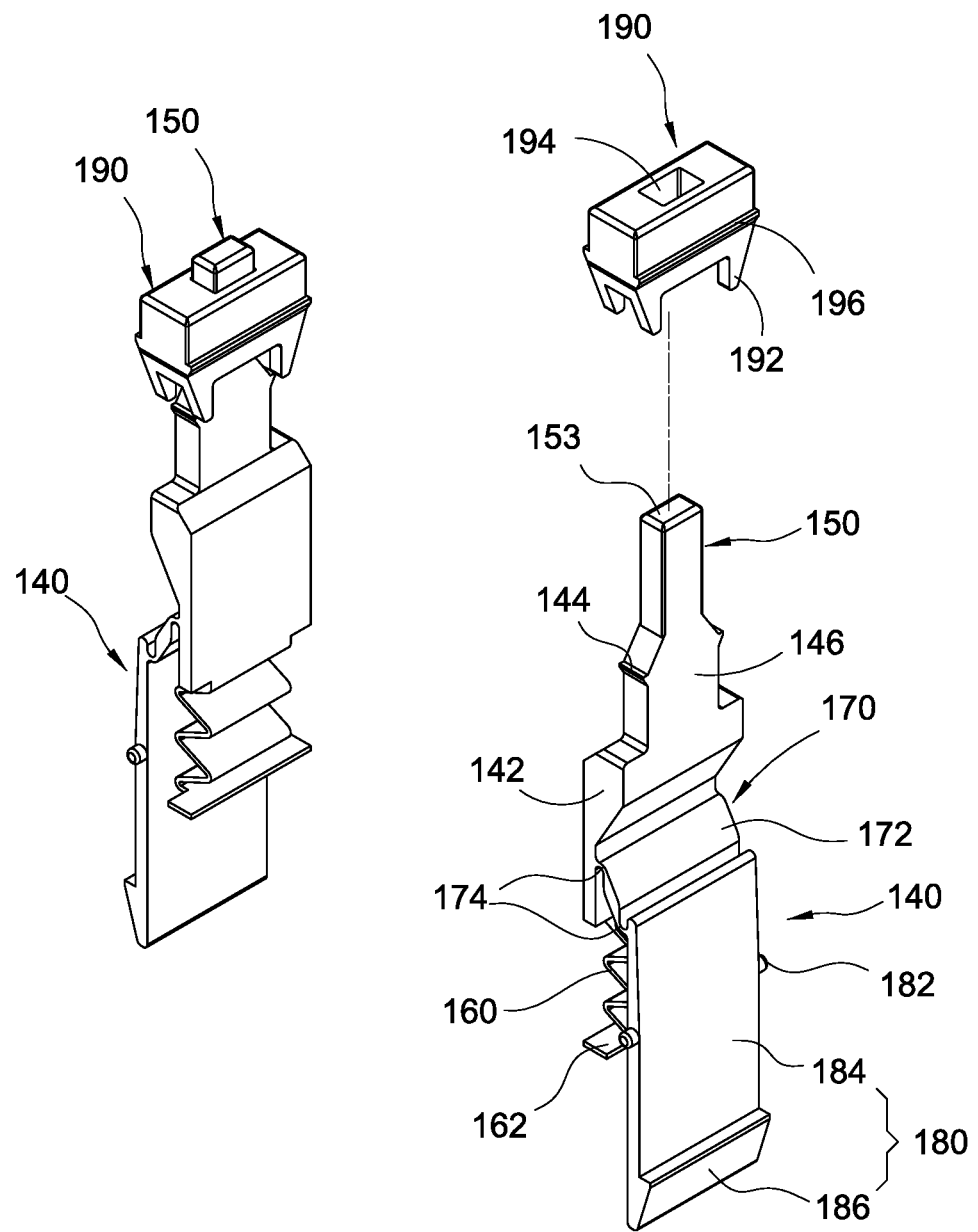
FIG. 17 is a perspective view showing the control element and the locking and release member according to the fifth embodiment of the present invention.
Figure 18:
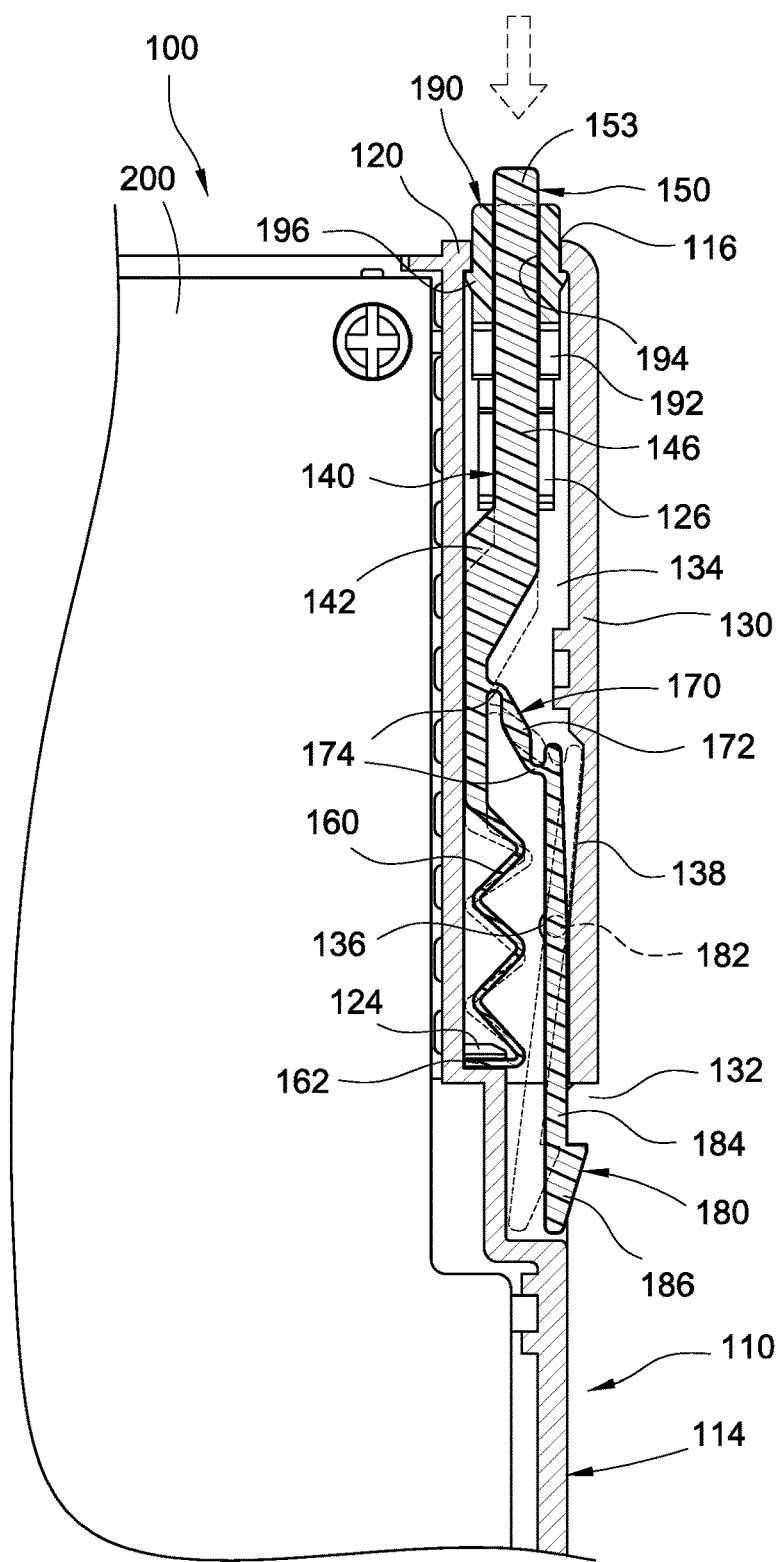
FIG. 18 is a partial cross-sectional view according to the fifth embodiment of the present invention.
Figure 19:
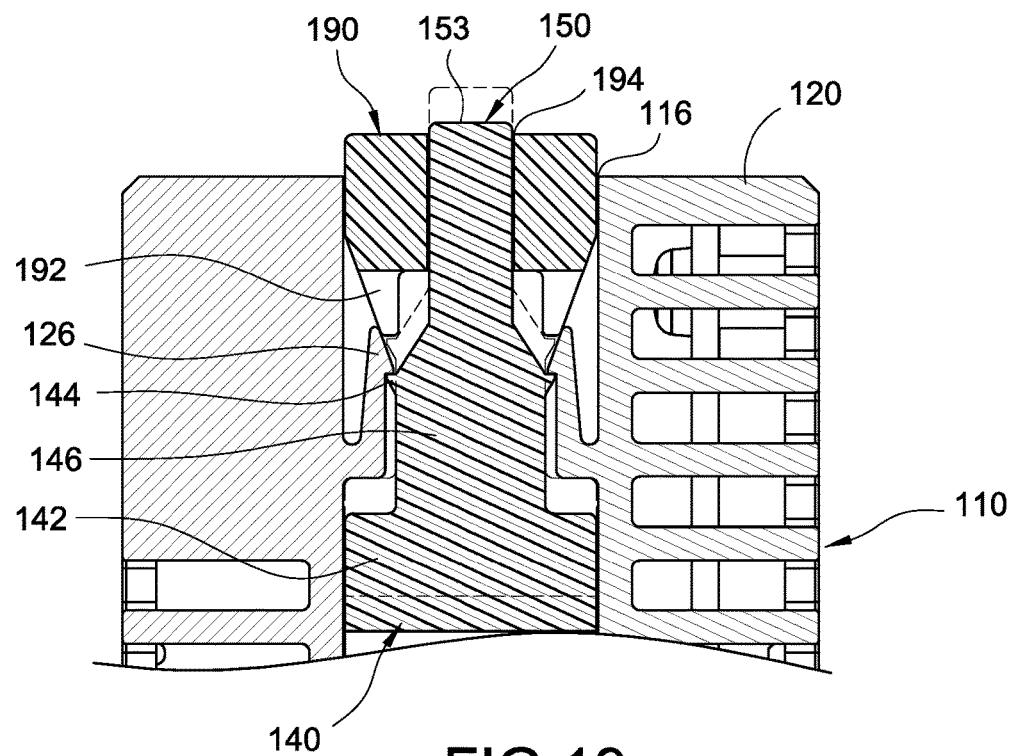
FIG. 19 is a cross-sectional view showing a first action according to the fifth embodiment of the present invention.
Figure 20:
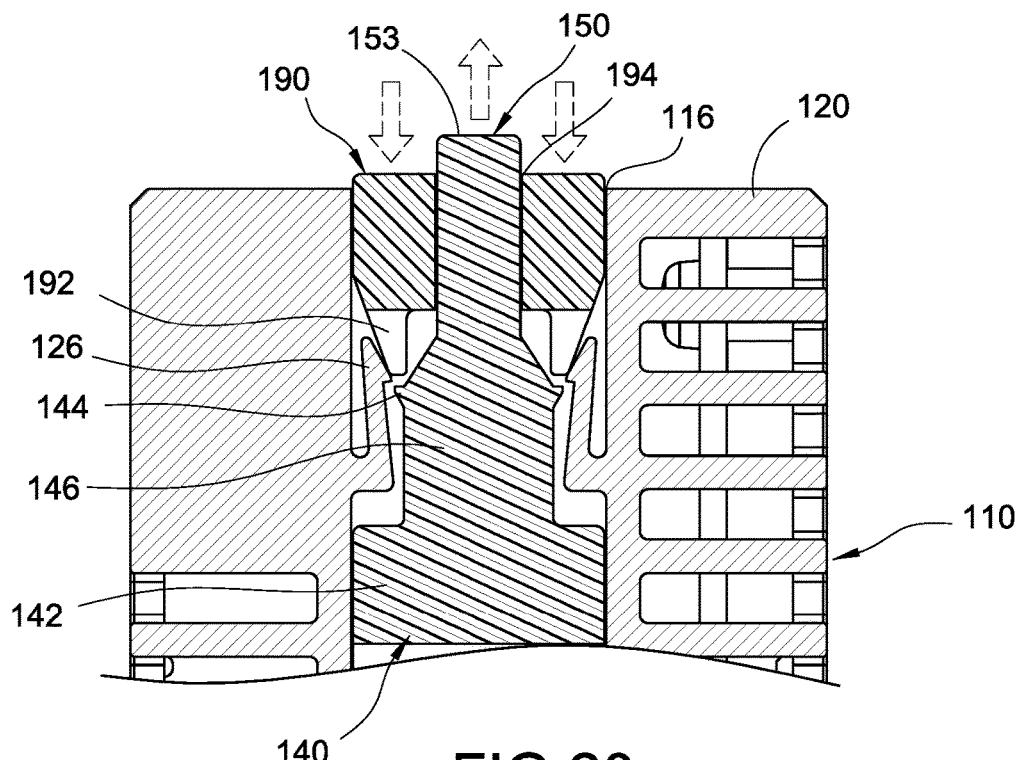
FIG. 20 is a cross-sectional view showing a second action according to the fifth embodiment of the present invention.

The present embodiment further includes two unlock buttons 190, and each unlock button 190 includes a plurality of foot portions 192, so as to release each button 153 from the locking position/state. As shown in FIGS. 17, 19 and 20, each foot portion 192 is inclined inwardly and is disposed corresponding to each resilient clasp 126. Each foot portion 192 presses each resilient clasp 126 outwardly to release each resilient clasp 126 from each of the protrusions 144. Furthermore, each unlock button 190 further includes a through hole 194 for insertion of the control element 150 and includes a limitation portion 196 for engagement with the housing 110. Each limitation portion 196 is, for example, a flange for limiting movement of each unlock button 190 with respect to the housing 110, so that each unlock button 190 is movable between the cover plate 120 and each resilient clasp 126.

When each control element 150 directly presses each button 153 to push down each arm 142 (pressing the button 153 to move it from the locking position to the releasing position), each protrusion 144 is engaged with each resilient clasp 126. At this point, the resilient element 160 is compressed and the connection element 170 pushes the fastening element 180 to move, so that the hook 186 of the fastening element 180 is away from the breach 132 (i.e., released from the fastening hole 20) to be released from the casing 10.

When the locking and release member 140 returns to the locking state (i.e. engaged with the casing 10), it is required to press each unlock button 190, so that each foot portion 192 moves down to push each resilient clasp 126 outwardly. At this point, each control element 150 and each arm 142 are automatically restored to their original positions by means of the action of the resilient element 160. Therefore, the button 153 returns to its original position, and the hook 186 of the housing device 100 is again engaged with the fastening hole 20 of the casing 10, i.e. in the locking state.

It should be noted that, since each foot portion 192 and each resilient clasp 126 have an inclined surface (not labelled, shown in FIG. 20) corresponding to each other, so that each resilient clasp 126 can be pushed outwardly in a smooth and elastic manner. When each resilient clasp 126 contacts the corresponding lateral wall 130, each unlock button 190 cannot be pressed down any further, thereby providing a limitation effect.

The present invention utilizes the control elements 150 of different structures. By operating the connection bar 158, operating each handle 156 or pressing each unlock button 190, or etc., each arm 142 can be depressed, thereby enhancing flexibility in operations or satisfying the users' needs in operations.

Moreover, in the second to fifth embodiments, the control elements 150 are two handles 156 separately disposed, the housing device 100 has to be detached and released from the casing 10 with the user's both hands. However, in different embodiments, there is a connection bar or other suitable connection part (not illustrated) connected to the two handles 156 to allow the users to operate conveniently at one time. Furthermore, in order to enable the locking and release member 140 to move stably in the elongated groove 134, the housing 110 further includes a plurality of support blocks 128 on each lateral wall 130, so that each support block 128 guides and limits each arm 142 to move stably with respect to the elongated groove 134.

Furthermore, by means of the lever principle, when the two arms 142 are depressed 142 by pressing each control element 150, one end of the fastening element 180 is pushed by each arm 142, and the other end (i.e. the hook 186) of the fastening element 180 is rotated about the pivot 182 to be away from the breach 132. Therefore, the fastening element 180 is released from or engaged with the fastening hole 20 of the casing 10 easily. Furthermore, each resilient element 160 automatically pushes back each arm 142 and each fastening element 180. Each hook 186 returns to each breach 132 again. Since the hook 186 of each fastening element 180 has a chamfer (not labelled) at one side, the housing device 100 can be engaged with the two fastening holes 20 of the casing 10 in a convenient and time-saving manner.

It is to be understood that the above descriptions are merely the preferable embodiments of the present invention and are not intended to limit the scope of the present invention. Equivalent changes and modifications made in the spirit of the present invention are regarded as falling within the scope of the present invention.

What is claimed is:

1. A housing device having a press-type locking and release structure, comprising:
 a housing (110), the housing (110) including two lateral walls (130), a breach (132) formed at each of the two lateral walls (130), an elongated groove (134) formed along each of the two lateral walls (130), and a pivot hole (136) formed at each of the two lateral walls (130), wherein each of the pivot holes (136) communicates with a respective corresponding one of the elongated grooves (134);
 a locking and release member (140), the locking and release member (140) including two arms (142) disposed in the two elongated grooves (134), a resilient element (160) disposed at one end of each of the arms (142), a connection element (170) connected to each of the arms (142), a fastening element (180) connected to each of the connection elements (170), and a pivot (182) protruding from one side of each of the fastening elements (180), wherein the pivot (182) is pivotally connected to the pivot hole (136); and
 at least one control element (150), the at least one control element (150) being connected to the two arms (142), wherein when the at least one control element (150) drives the two arms (142) to move with respect to the two elongated grooves (134), each of the arms (142) drives each of the connection elements (170) to push and move one end of each of the fastening elements (180), and another end of each of the fastening elements (180) is away from the breach (132).

2. The housing device having the press-type locking and release structure of claim 1, wherein each of the control elements (150) includes a push portion (152), each of the arms (142) includes a contact end (146) corresponding to each of the push portions (152), and the push portion (152) rotatably or movably pushes the contact end (146) to move the arm (142) downward.

3. The housing device having the press-type locking and release structure of claim 2, wherein each of the push portions (152) is an arc portion, a cam, or a cylindrical cam, and each of the contact ends (146) includes a planar surface (1462) or includes the planar surface (1462) and a chamfer (148) connected to the planar surface (1462).

4. The housing device having the press-type locking and release structure of claim 2, wherein each of the push portions (152) has a curved surface or an arc portion, each of the contact ends (146) includes a planar surface (1462) and a curvy surface (1466) connected to the planar surface (1462), and the curved surface or the arc portion moves from the planar surface (1462) to the curvy surface (1466) to push the arm (142) to move.

5. The housing device having the press-type locking and release structure of claim 2, wherein each of the push portions (152) is a button (153), and each of the contact ends (146) is integrally formed with each of the buttons (153).

6. The housing device having the press-type locking and release structure of claim 5, further comprising two unlock buttons (190) receiving the two buttons (153) respectively and two resilient clasps (126) driven by the unlock buttons (190), the button (153) including two protrusions (144) corresponding to the two resilient clasps (126) respectively.

7. The housing device having the press-type locking and release structure of claim 1, wherein the housing (110) further includes two resilient clasps (126) extending from two sides of the elongated groove (134) respectively, and each of the arms (142) includes two protrusions (144) disposed corresponding to the two resilient clasps (126).

8. The housing device having the press-type locking and release structure of claim 7, further comprising two unlock buttons (190), each unlock button (190) having a plurality of foot portions (192), each of the foot portions (192) being disposed corresponding to each of the resilient clasps (126) to press each of the resilient clasps (126) outwardly to release each of the resilient clasps (126) from each of the protrusions (144).

9. The housing device having the press-type locking and release structure of claim 8, wherein each of the unlock buttons (190) includes a through hole (194) for insertion of the control element (150) and includes a limitation portion (196) for engagement with the housing (110).

10. The housing device having the press-type locking and release structure of claim 1, wherein each control element (150) includes a pivot portion (154) pivotally connected to the housing (110) and a handle (156) connected to the pivot portion (154), the housing (110) includes an aperture (116) disposed corresponding to the pivot portion (154), and the handle (156) protrudes out of the housing (110).

11. The housing device having the press-type locking and release structure of claim 10, wherein the control element (150) further includes a connection bar (158) connected to each handle (156).

12. The housing device having the press-type locking and release structure of claim 1, wherein each of the arms (142) is parallel to each of the fastening elements (180), and each of the connection elements (170) is connected to the arm (142) and the fastening element (180).

13. The housing device having the press-type locking and release structure of claim 12, wherein each of the connection elements (170) further includes a body (172) and includes two connection ends (174) connected to the arm (142) and the fastening element (180) respectively, and a thickness of the connection end (174) is less than a thickness of the body (172).

14. The housing device having the press-type locking and release structure of claim 1, wherein each of the lateral walls (130) includes a recess (138) adjacent to the pivot hole (136), and each of the recesses (138) receives one end of each of the fastening elements (180).

15. The housing device having the press-type locking and release structure of claim 1, wherein each of the fastening elements (180) further includes a fastening plate (184) and a hook (186) at one end of the fastening plate (184), the pivot (182) protrudes from at least one side of the fastening plate (184), and each of the hooks (186) is disposed corresponding to each of the breaches (132).

16. The housing device having the press-type locking and release structure of claim 1, wherein one end of each of the resilient elements (160) includes a positioning end (162), the housing (110) includes a joining member (124) corresponding to each of the positioning ends (162), and each of the positioning ends (162) is engaged with each of the joining members (124).

17. The housing device having the press-type locking and release structure of claim 1, wherein each of the resilient elements (160) is integrally formed with each of the arms (142).

18. The housing device having the press-type locking and release structure of claim 17, wherein each of the resilient elements (160) is a flat spring or a plate spring.

19. The housing device having the press-type locking and release structure of claim 1, wherein the housing (110) includes a first housing part (112) and a second housing part (114) coupled to each other.

20. The housing device having the press-type locking and release structure of claim 19, wherein the first housing part (112) includes two slots (115) communicating with the two elongated grooves (134) respectively and includes a plurality of fastening points (118) disposed on an inner side of each of the lateral walls (130), and the second housing part (114) includes a cover plate (120) covering each of the elongated grooves (134) and includes a plurality of engagement plates (122) disposed corresponding to the fastening points (118).

* * * * *